US 6,720,271 B2

(12) United States Patent
Bellandi et al.

(10) Patent No.: US 6,720,271 B2
(45) Date of Patent: Apr. 13, 2004

(54) PROCESS FOR REMOVING POLYMERS DURING THE FABRICATION OF SEMICONDUCTOR DEVICES

(75) Inventors: Enrico Bellandi, Agrate Brianza (IT); Francesco Pipia, Milan (IT); Mauro Alessandri, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/189,152

(22) Filed: Jul. 2, 2002

(65) Prior Publication Data

US 2003/0027429 A1 Feb. 6, 2003

Related U.S. Application Data

(60) Provisional application No. 60/302,920, filed on Jul. 2, 2001.

(51) Int. Cl.⁷ ............................................. H01L 21/302
(52) U.S. Cl. ........................................ 438/710; 438/714
(58) Field of Search ................................. 438/710, 692, 438/700, 706, 719, 724; 134/26, 30

(56) References Cited

U.S. PATENT DOCUMENTS

| | | | | |
|---|---|---|---|---|
| 5,716,495 A | * | 2/1998 | Butterbaugh et al. | 438/708 |
| 6,124,211 A | * | 9/2000 | Butterbaugh et al. | 438/708 |
| 6,277,752 B1 | * | 8/2001 | Chen | 438/692 |
| 6,383,724 B1 | * | 5/2002 | Carter et al. | 430/329 |
| 6,493,763 B1 | * | 12/2002 | Suzuki | 709/231 |

* cited by examiner

Primary Examiner—John F. Niebling
Assistant Examiner—Olivia T. Luk
(74) Attorney, Agent, or Firm—Lisa K. Jorgenson; Robert Iannucci; SEED IP Law Group PLLC

(57) ABSTRACT

The present invention relates to a process for removing post-etch residues or polymers from the surface of semiconductor devices which comprises treating the semiconductor device with an aqueous ammonia or ammonium hydroxide solution, optionally containing ozone for a time sufficient to effectively remove said post-etch residues or polymers from the surface of the semiconductor device and rinsing the semiconductor device with ozonized water, i.e. water enriched with ozone, in which water is preferably deionized (ozone-DIW).

27 Claims, 2 Drawing Sheets

PROCESS FOR REMOVING POLYMERS DURING THE FABRICATION OF SEMICONDUCTOR DEVICES

BACKGROUND OF THE INVENTION

1. Field of the Invention

In its general aspect, the present invention relates to the fabrication of semiconductor devices.

In particular, the present invention relates to a process for removing residues or polymers formed on structures of semiconductor devices after etching.

2. Description of the Related Art

Conventional fabrication of electronic devices typically involves placing numerous device structures on a single monolithic substrate. The device structures are then electrically interconnected by means of conductive structures formed in layers on the monolithic substrate. The conductive structures can be for instance horizontal metal lines and vertical conductive structures called vias between layers, with dielectric material disposed between the conductive structures so as to implement desired circuit function.

During the fabrication of semiconductor devices, it is typical to realize conductive structures, such as metal lines and vias, by etching processes, such as plasma etching.

During the etching process of semiconductor structures having a silicon oxide as dielectric layer, one or more metal layers and a photo-resist, after exposure and development of the photo-resist, residues are sometimes deposited on sidewalls of the formed conductive structures. These residues, also known as polymers, include both organic and inorganic components and need to be removed since, it is well known in the art that the presence of such residues and polymers can affect the reliability of the semiconductor devices.

However, the removal of the above polymer materials is a difficult problem in the semiconductor industry. In current fabrication processes, these polymers are later removed by cleaning processes which involve treating the semiconductor device with high cost and toxic solvents. The process flow is normally burdened with particular and complicated rinsing methodologies without which there is a very high risk of corrosion of the metal layers, resulting in large problems of defects, and from the interruption of the continuity of the metal lines.

Furthermore, the solvents used in the above mentioned cleaning processes themselves leave residues that are then difficult to remove.

It would, therefore, be desirable to provide a new process for the selective removal of residues left on a semiconductor structure after an etching process, in particular a plasma etching, which leaves the surface as clean as possible, reduces the environmental impact, and simplifies the work of choosing the machines for the production of semiconductor devices.

BRIEF SUMMARY OF THE INVENTION

The present invention relates to a novel process for removing post-etch residues or polymers from the surface of semiconductor devices which comprises treating the semiconductor device with an aqueous ammonia or ammonium hydroxide solution, optionally containing ozone for a time sufficient to effectively remove said post-etch residues or polymers from the surface of the semiconductor device and rinsing the semiconductor device with ozonized water, i.e. water enriched with ozone, in which water is preferably deionized (ozone-DIW).

According to an embodiment of the present invention, the new process comprises the steps of:

treating the semiconductor device with an aqueous ammonia or ammonium hydroxide solution for a time sufficient to effectively remove said post-etch residues or polymers from the surface thereof, and then rinsing the semiconductor device with ozonized water.

According to another embodiment of the present invention, the new process comprises the steps of:

treating the semiconductor device with ozonized water and then with an aqueous ammonia or ammonium hydroxide solution for a time sufficient to effectively remove said post-etch residues or polymers from the surface thereof, and then rinsing the semiconductor device with ozonized water.

According to a further embodiment of the present invention, the new process comprises the steps of:

treating the semiconductor device with an aqueous ammonia or ammonium hydroxide solution containing ozone for a time sufficient to effectively remove said post-etch residues or polymers from the surface thereof, and then rinsing the semiconductor device with ozonized water.

The features and advantages of the process according to the invention will be better understood from the following description of preferred embodiments thereof, given by way of non-limitative example with reference to the accompanying drawings.

DETAILED DESCRIPTION OF THE PREFERRED EMBODIMENTS

Figure 1:
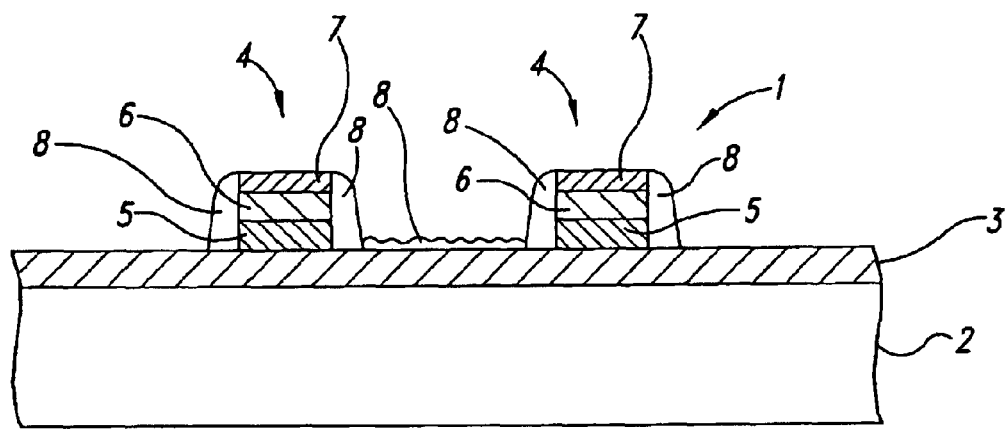
FIG. 1 is a cross-sectional view of a portion of a semiconductor device with metal lines formed by etching and having polymers thereon.

The present invention relates to a novel process for removing post-etch residues or polymers from the surface of semiconductor devices which comprises treating the semiconductor device with an aqueous ammonia or ammonium hydroxide solution, optionally containing ozone for a time sufficient to effectively remove said post-etch residues or polymers from the surface of the semiconductor device and rinsing the semiconductor device with ozonized water, i.e. water enriched with ozone, in which water is preferably deionized (ozone-DIW).

The concentration of ammonia or ammonium hydroxide in the aqueous solution should be comprised within the range of 10–5000 ppm, preferably within the range of 100–3000 ppm. The treatment of the semiconductor device with ammonia or ammonium hydroxide in aqueous solution is preferably made at room temperature for a time comprised in the range of 5 seconds to 15 minutes, preferably 15 seconds to 5 minutes.

The concentration of ozone in the ozonized water and, where necessary, in the aqueous solution of ammonia or ammonium hydroxide should be not below 5 ppm and is preferably comprised within the range of 5–30 ppm, most preferably 5–15 ppm. The treatment of the integrated circuit device with ozonized water is preferably made at room temperature for a time comprised in the range of 5 seconds to 15 minutes, preferably 5–10 minutes using a dipping or spraying equipment or 15 seconds to 1 minute using single wafer machines.

The treatment with ammonia or ammonium hydroxide in aqueous solution and the rinsing with ozonized water can be performed in several ways, for example by immersion of a single semiconductor device or groups (batch) in the above solutions for the prescribed time. Spraying of the solutions onto the semiconductor devices can also be used.

Generally, during the process flow for the fabrication of semiconductor devices, when a polymer needs to be removed, three different layers and corresponding materials are basically exposed on the semiconductor device surface: dielectric layer ($SiO_2$), -metallization layer (AlCu, Cu etc.), barrier layer metal/dielectric (TiN, Ti etc.).

In the polymers removal process according embodiments of to the invention, dielectric and metallization layers are slowly chemically attacked by ammonia or ammonium hydroxide in aqueous solution resulting in the separation of residual post-etch polymers from the exposed surface of the above layers through a particle removal mechanism. The barrier layer is instead not affected by the treatment with ammonia or ammonium hydroxide in aqueous solution.

For example, in the case of a metallization layer comprising Al, the chemical reaction for this attack is as follows:

$$2Al + 2OH + 2H_2O \rightarrow 2AlO_2 + 3H_2$$

However, according to embodiments of the invention, the chemical attack mentioned above will only provoke a slight etch of the layers concerned, so resulting in no significant damage of the layers, such as tightening of the metal lines, enlargment of vias and trenches in the dielectric layer.

This result is achieved by embodiments of the present invention thanks to the fact that the concentration of ammonia or ammonium hydroxide in the aqueous solution is kept very low but enough to effectively remove the polymers and, at the same time, avoid any damage to the semiconductor device which could adversely affect its functionality and reliability. Also, the alkaline pH of the above aqueous solution together with the low concentration of ammonia or ammonium hydroxide in it, strongly reduce the possibility of particle deposition.

Furthermore, in the process according to embodiments of the invention, ozone, in form of ozonized water, is also used to improve the polymers removal efficiency. Substantially, ozone contributes to the polymers removal process with the following effects:

1) it promotes the formation of protective oxides on the metal surface of metallization layer (for example $Al_2O_3$ in case of a conductive layer comprising Al);
2) it promotes oxidation and detachment of post-etch polymers including organic residues deriving from photo-resist materials which are normally used for masking purposes.

According to embodiments of the present invention, ozonized water is used in all embodiments as a rinsing medium of the semiconductor device after the treatment with the aqueous solution of ammonia or ammonium hydroxide. In addition, in some embodiments, ozone can also advantageously be used to optimize the ability and rate of attack of ammonia or ammonium hydroxide to the exposed layers on the semiconductor device.

For example, when a better protection of the metal surface is desired, it might be useful to reduce the ammonia or ammonium hydroxide etch rate by adding ozone to the ammonia or ammonium hydroxide aqueous solution. In this case, the etch rate of the metal surface will be reduced since simultaneously ozone will promote the formation of protective oxides on the metal surface.

To this purpose, embodiments of the present invention also foresee to treat the semiconductor device with ozonized water first so as to promote the formation of protective oxides and then with the aqueous solution of ammonia or ammonium hydroxide followed by the rinsing step with ozonized water again.

The process according to the invention is now further illustrated with reference to the accompanying drawings.

With reference to FIG. 1, there is shown a portion of a semiconductor device which is globally indicated with the reference number 1. The semiconductor device 1 comprises a substrate 2 having a dielectric layer 3 formed thereon. The dielectric layer 3 is preferably $SiO_2$ which is deposited by conventional methods, such as, for example, chemical vapor deposition. The semiconductor device 1 further comprises metal lines indicated globally by 4 formed on the dielectric layer 3 as a result of etching processes, for example plasma etching.

In particular, each metal line 4 comprises a first metal layer 5, comprising preferably Ti or TiN on the surface of the dielectric layer 3, a second metal layer 6 (metallization layer) of a metal comprising aluminum (Al) or aluminum alloy on the first metal layer 5 and a third metal layer 7 preferably comprising preferbly Ti or TiN on the second metal layer 6. As a result of the etching process, residual polymers 8 are created on side walls of metal lines 4 and on the surface of the dielectric layer 3 between the metal lines 4.

Figure 2:
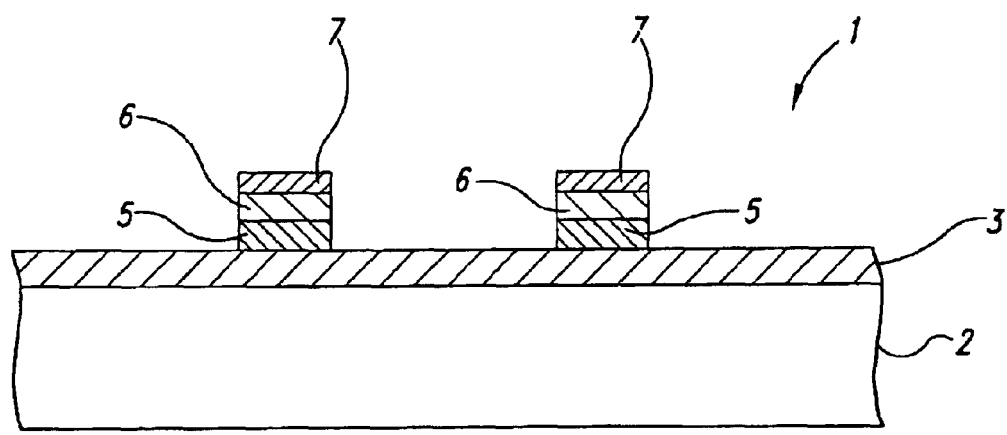
FIG. 2 is a cross-sectional view of the semiconductor device portion of FIG. 1 after removal of polymers with the process according to the invention.

FIG. 2 shows the semiconductor device 1 after removal of polymers 8 with the process according to embodiments of the invention. Basically, all three layers 5, 6 and 7 of metal lines 4 and dielectric layer 3 are exposed on the surface during the process flow according to the invention.

In particular, by treating the semiconductor device 1 with an aqueous solution containing ammonia or ammonium hydroxide, the metallization layer 6 and the dielectric layer 3 are slowly chemically attacked resulting in the easier separation of residual polymers 8 from the side walls of metal lines 4 and from the surface of dielectric layer through a particle removal mechanism.

However, the chemical attack mentioned above only provoke a slightly etch of the layers concerned, so resulting in no damage or minimum damage of the exposed layers in terms of tightening of the metal lines 4 and trenches in the dielectric layer 3.

This is mainly achieved thanks to the concentration of ammonia or ammonium hydroxide in the aqueous solution thereof which is kept low enough to effectively remove the polymers and, at the same time, avoid any damage to the semiconductor device which could adversely affect its funcionality and reliability.

Furthermore, in the process according to embodiments of the invention, ozone, in form of ozonized water allows to improve the polymers removal efficiency and protect metal layers as specified herein before.

Figure 3:
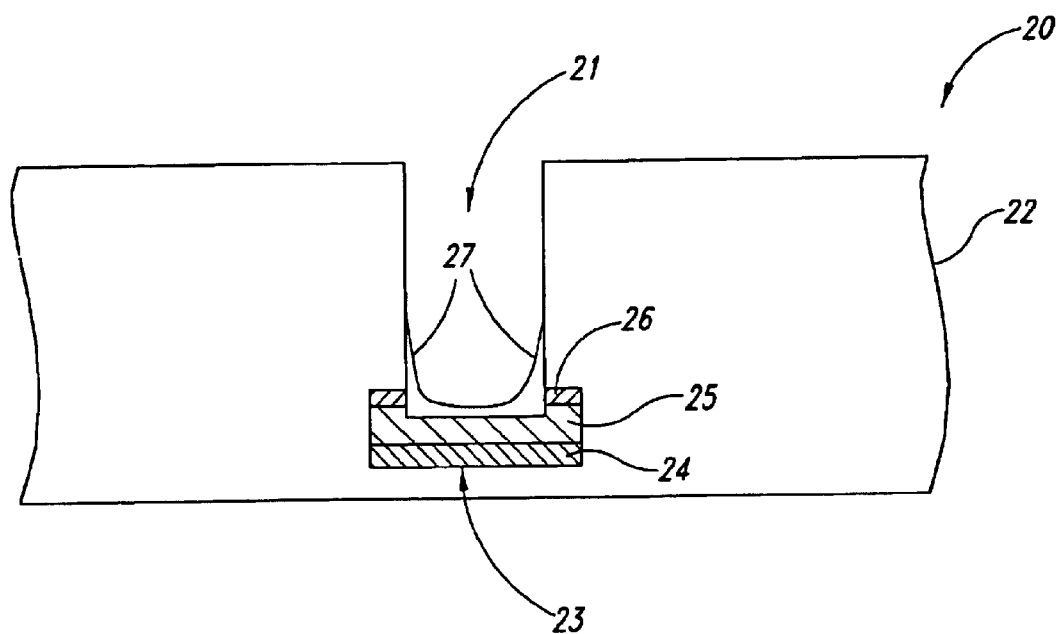
FIG. 3 is a cross-sectional view of a portion of a semiconductor device with a via hole formed by etching and having polymers thereon.

FIG. 3 shows a portion of a semiconductor device, globally indicated with reference number 20, having a via hole 21 formed by etching.

The semiconductor device 20 comprises a dielectric layer 22 in which a conductive structure 23 comprising a first metal layer 24, a second metal layer 25 (metallization layer) on the first metal layer 24 and a third metal layer 26 on the metallization layer 25 is encased. A via hole 21 is formed by etching at the level of the dielectric layer 22 and of the third metal layer 26 so as to expose a surface of the metallization layer 25 for the electrical contact.

As a result of the etching process, residual polymers 27 are also created on side walls of the dielectric layer 22 and of the third metal layer 26, and on the exposed surface of the metallization layer 25.

Figure 4:
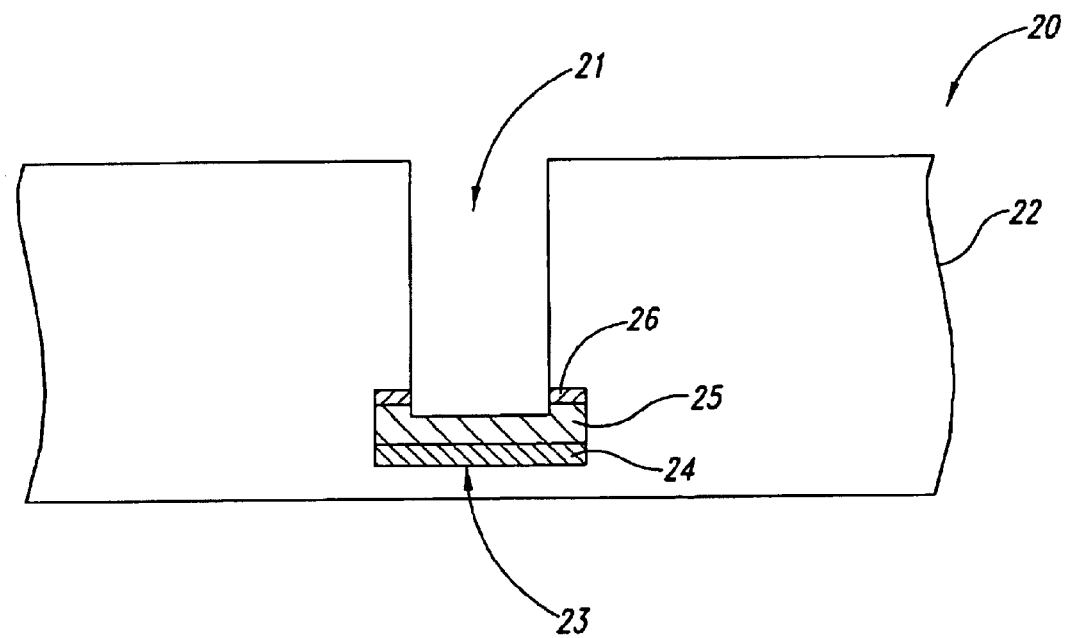
FIG. 4 is a cross-sectional view of the semiconductor device portion of FIG. 3 after removal of polymers with the process according to the invention.

FIG. 4 shows the semiconductor device 20 after removal of polymers 27 with the process according to embodiments of the invention. In this case, by treating the semiconductor device 20 with an aqueous solution containing ammonia or ammonium hydroxide, the metallization layer 25 and the dielectric layer 22 are slowly chemically attacked resulting in the easier separation of residual polymers 27 from the side walls of the dielectric layer 22 and from the surface of metallization layer 25 through a particle removal mechanism.

However, the chemical attack mentioned above only provoke a slightly etch of the layers concerned, so resulting in no damage or minimum damage of the exposed layers in terms of enlargement of via hole 21 and trenches in the dielectric layer 22.

The main advantage of the process according to embodiments of the invention is that it allows an high removal efficiency of residues left on conductive structures of semiconductor devices after an etching process, without, at the same time, provoking appreciable damages to the devices such as tightening of metal lines, enlargment of vias and trenches in the dielectric layer.

A further advantage of the process according to embodiments of the invention lies in the use of aqueous solutions which have a reduced environmental impact compared to that of toxic solvents used in the prior art processes.

In addition, the process according to embodiments of the invention can be performed with existing machinery used in the fabrication of semiconductor devices and allows to reduce the consumption of working parts of such a machinery (e.g. filters) so simplifying the process flow.

To further illustrate the process according to embodiments of the invention, the following non-limitative examples are herein reported.

EXAMPLE 1

A semiconductor device comprising a silicon substrate 2, a dielectric layer 3, a first TiN metal layer 500 Angstroms thick, a second metal layer (metallization layer) comprising Al 5000 Angstroms thick and a third TiN metal layer 500 Angstroms thick, was masked with a 1.5 micron thick photo-resist mask and then inserted into an anisotropic etching apparatus in order to obtain metal lines 4.

The etching was performed in a conventional way using plasma.

The etched semiconductor device was then removed from the anisotropic etching apparatus and dipped for about 1 minute in an aqueous solution of ammonium hydroxide having a concentration of 3000 ppm. The aqueous solution was at room temperature. The semiconductor device was then removed from the aqueous ammonium hydroxide bath and was rinsed at room temperature with ozonized water (ozone-DIW) in which the concentration of ozone was 15 ppm. After rinsing for about 5 minutes the semiconductor device was allowed to dry.

After the above treatments, the semiconductor device was examined under a scanning electron microscope and found to have a structure free from post-etch polymers on sidewalls of the metal lines 4 and on the exposed surface of the dielectric layer 3. In addition, no substantial tightening of the metal lines 4 and no visible trenches of the dielectric layer 3 were found.

EXAMPLE 2

An etched semiconductor device obtained as described in example 1 was dipped for about 90 seconds in an aqueous solution containing ammonium hydroxide having a concentration of 3000 ppm and ozone having a concentration of 15 ppm. The aqueous solution was at room temperature. The semiconductor device was then removed from the aqueous ammonium hydroxide/ozone bath and was rinsed at room temperature with ozonized water (ozone-DIW) in which the concentration of ozone was 15 ppm. After rinsing for about 5 minutes, the semiconductor device was allowed to dry.

After the above treatments, the semiconductor device was examined under a scanning electron microscope and found to have a structure free from post-etch polymers on sidewalls of the metal lines 4 and on the exposed surface of the dielectric layer 3. In addition, no substantial tightening of the metal lines 4 and no visible trenches of the dielectric layer 3 were found.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for removing post-etch residues or polymers from the surface of semiconductor devices which comprises treating the semiconductor device with an aqueous ammonia or ammonium hydroxide solution for a time sufficient to effectively remove said post-etch residues or polymers from the surface thereof and rinsing the semiconductor device with ozonized water.

2. The process according to claim 1, in which the concentration of ammonia or ammonium hydroxide in aqueous solution is comprised within the range of 10–5000 ppm.

3. The process according to claim 1, in which the treatment of the semiconductor device with the aqueous ammonia or ammonium hydroxide solution is performed by dipping the semiconductor device in the aqueous ammonia or ammonium hydroxide solution for a time comprised within the range of 5 seconds to 15 minutes.

4. The process according to claim 1, in which the treatment of the semiconductor device with the aqueous ammonia or ammonium hydroxide solution is performed by spraying the aqueous ammonia or ammonium solution onto the semiconductor device.

5. The process according to claim 1, in which the concentration of ozone in ozonized water is not below 5 ppm.

6. The process according to claim 5, in which the concentration of ozone in ozonized water is comprised within the range of 5–30 ppm.

7. The process according to claim 6 in which ozonized water is ozone-DIW.

8. A process for removing post-etch residues or polymers from the surface of semiconductor devices which comprises treating the semiconductor device with ozonized water and then with an aqueous ammonia or ammonium hydroxide solution for a time sufficient to effectively remove said post-etch residues or polymers from the surface thereof, and then rinsing the semiconductor device with ozonized water.

9. The process according to claim 8, in which the concentration of ammonia or ammonium hydroxide in aqueous solution is comprised within the range of 10–5000 ppm.

10. The process according to claim 8, in which the treatment of the semiconductor device with the aqueous ammonia or ammonium hydroxide solution is performed by dipping the semiconductor device in the aqueous ammonia or ammonium hydroxide solution for a time comprised within the range of 5 seconds to 15 minutes.

11. The process according to claim 8, in which the treatment of the semiconductor device with the aqueous ammonia or ammonium hydroxide solution is performed by spraying the aqueous ammonia or ammonium solution onto the semiconductor device.

12. The process according to claim 8, in which the concentration of ozone in ozonized water is not below 5 ppm.

13. The process according to claim 12, in which the concentration of ozone in ozonized water is comprised within the range of 5–30 ppm.

14. The process according to claim 13 in which ozonized water is ozone-DIW.

15. A process for removing post-etch residues or polymers from the surface of semiconductor devices which comprises treating the semiconductor device with an aqueous ammonia or ammonium hydroxide solution containing ozone for a time sufficient to effectively remove said post-etch residues or polymers from the surface thereof, and then rinsing the semiconductor device with ozonized water.

16. The process according to claim 15, in which the concentration of ammonia or ammonium hydroxide in aqueous solution is comprised within the range of 10–5000 ppm.

17. The process according to claim 15, in which the treatment of the semiconductor device with the aqueous ammonia or ammonium hydroxide solution is performed by dipping the semiconductor device in the aqueous ammonia or ammonium hydroxide solution for a time comprised within the range of 5 seconds to 15 minutes.

18. The process according to claim 15, in which the treatment of the semiconductor device with the aqueous ammonia or ammonium hydroxide solution is performed by spraying the aqueous ammonia or ammonium solution onto the semiconductor device.

19. The process according to claim 15, in which the concentration of ozone in the aqueous ammonia or ammonium hydroxide solution ozonized is not below 5 ppm and preferably 5–30 ppm.

20. The process according to claim 15, in which the concentration of ozone in ozonized water is not below 5 ppm and preferably 5–30 ppm.

21. The process according to claim 20 in which ozonized water is ozone-DIW.

22. A method comprising:

treating a semiconductor device with a 10–5000 ppm aqueous ammonia solution for 5 seconds to 15 minutes; and rinsing the semiconductor device with ozonized water having an ozone concentration not less than 5 ppm ozone.

23. The method of claim 22 wherein the ozonized water is ozone-DIW.

24. The method of claim 22 wherein the 10–5000 ppm aqueous ammonia solution further includes not less than 5 ppm ozone.

25. A method comprising:

treating a semiconductor device with a 10–5000 ppm ammonium hydroxide solution for 5 seconds to 15 minutes; and rinsing the semiconductor device with ozonized water having an ozone concentration not less than 5 ppm ozone.

26. The method of claim 25 wherein the ozonized water is ozone-DIW.

27. The method of claim 25 wherein the 10–5000 ppm aqueous ammonia solution further includes not less than 5 ppm ozone.

* * * * *